US010545588B2

United States Patent
Li et al.

(10) Patent No.: US 10,545,588 B2
(45) Date of Patent: Jan. 28, 2020

(54) DISPLAY PANEL, MANUFACTURING METHOD THEREOF AND DISPLAY DEVICE (71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yue Li, Beijing (CN); Xi Chen, Beijing (CN); Shijun Wang, Beijing (CN); Zhenhua Lv, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 8 days.

(21) Appl. No.: 15/563,284

(22) PCT Filed: Mar. 24, 2017

(86) PCT No.: PCT/CN2017/078031
§ 371 (c)(1),
(2) Date: Sep. 29, 2017

(87) PCT Pub. No.: WO2017/193712
PCT Pub. Date: Nov. 16, 2017

(65) Prior Publication Data
US 2018/0196536 A1 Jul. 12, 2018

(30) Foreign Application Priority Data
May 13, 2016 (CN) .......................... 2016 1 0319653

(51) Int. Cl.
G06F 3/041 (2006.01)
G09G 3/36 (2006.01)
H01L 27/32 (2006.01)

(52) U.S. Cl.
CPC ............. *G06F 3/041* (2013.01); *G09G 3/364* (2013.01); *H01L 27/3276* (2013.01)

(58) Field of Classification Search
CPC ..... G06F 3/041; G06F 3/0412; G09G 3/2003; G09G 3/364; H01L 27/323; H01L 27/3276
(Continued)

(56) References Cited

U.S. PATENT DOCUMENTS

2010/0207852 A1* 8/2010 Cok .......................... G09G 3/20
345/83
2010/0315362 A1 12/2010 Cheng et al.
(Continued)

FOREIGN PATENT DOCUMENTS

CN 102955637 A 3/2013
CN 104536632 A 4/2015
(Continued)

OTHER PUBLICATIONS

Office Action received for Chinese Patent Application No. 201610319653.5, dated Dec. 27, 2017, 13 pages (7 pages of English Translation and 6 pages of Office Action).
(Continued)

*Primary Examiner* — Prabodh M Dharia
(74) *Attorney, Agent, or Firm* — Womble Bond Dickinson (US) LLP (57) ABSTRACT A display panel, including: a pixel structure constituted by a plurality of sub-pixels, wherein sub-pixels in each row are arranged in alignment, sub-pixels in every two adjacent rows are spaced in a column direction by a distance of X
(Continued)

sub-pixels, $0<X<1$, and a color of each sub-pixel differs from a color of an adjacent sub-pixel; a plurality of data lines arranged at column gaps between the sub-pixels; a plurality of touch signal lines arranged at gaps between the sub-pixels, wherein the plurality of touch signal lines are arranged in a different layer from the plurality of data lines and are insulated from the plurality of data lines; and a plurality of touch detection electrodes connected with the plurality of touch signal lines. A method for manufacturing the above display panel and a display device.

11 Claims, 5 Drawing Sheets

(58) Field of Classification Search
USPC .................................. 345/55, 83; 359/464
See application file for complete search history.

(56) References Cited

U.S. PATENT DOCUMENTS

| | | | |
|---|---|---|---|
| 2014/0048854 A1* | 2/2014 | Wang | G06F 3/0412 |
| | | | 257/254 |
| 2014/0062943 A1 | 3/2014 | Choi et al. | |
| 2014/0063602 A1* | 3/2014 | Wu | G09F 19/14 |
| | | | 359/464 |
| 2014/0078025 A1* | 3/2014 | Allio | G02B 27/2214 |
| | | | 345/55 |
| 2014/0125626 A1 | 5/2014 | Yang et al. | |
| 2014/0240286 A1* | 8/2014 | Chang | G02F 1/13338 |
| | | | 345/174 |
| 2015/0220174 A1* | 8/2015 | Mu | G06F 3/044 |
| | | | 345/174 |
| 2015/0309644 A1* | 10/2015 | Sun | G06F 3/0412 |
| | | | 345/173 |
| 2016/0246399 A1* | 8/2016 | Huang | G06F 3/044 |
| 2016/0323566 A1* | 11/2016 | Vdovin | G02B 27/2214 |
| 2016/0328074 A1 | 11/2016 | Peng | |
| 2016/0342006 A1* | 11/2016 | Tamaki | G02F 1/13439 |
| 2016/0357313 A1* | 12/2016 | Yang | G06F 3/044 |
| 2016/0370919 A1 | 12/2016 | Xu et al. | |
| 2017/0038887 A1* | 2/2017 | Zhang | G02F 1/136227 |
| 2017/0068360 A1* | 3/2017 | Yuan | G06F 3/047 |
| 2017/0083129 A1 | 3/2017 | Jin | |
| 2017/0090636 A1* | 3/2017 | Ding | G06F 3/0412 |
| 2017/0102916 A1* | 4/2017 | Noble | G06F 3/013 |
| 2017/0177159 A1 | 6/2017 | Cao et al. | |
| 2017/0294172 A1* | 10/2017 | Yang | G02F 1/1345 |
| 2017/0299908 A1* | 10/2017 | Peng | G06F 3/044 |
| 2017/0300155 A1* | 10/2017 | Gu | G06F 3/044 |
| 2017/0315643 A1* | 11/2017 | Shim | G06F 3/0412 |
| 2018/0188858 A1* | 7/2018 | Zhang | G06F 3/0412 |

FOREIGN PATENT DOCUMENTS

| | | |
|---|---|---|
| CN | 104808403 A | 7/2015 |
| CN | 105117069 A | 12/2015 |
| CN | 105224131 A | 1/2016 |
| CN | 105468202 A | 4/2016 |
| CN | 105572935 A | 5/2016 |
| CN | 105788466 A | 7/2016 |
| CN | 105845033 A | 8/2016 |
| CN | 205670287 U | 11/2016 |
| KR | 20130020485 A | 2/2013 |
| KR | 20130020485 A | 9/2014 |

OTHER PUBLICATIONS

International Search Report and Written Opinion in PCT/CN2017/078031 dated Jun. 26, 2017, with English translation.

* cited by examiner

DISPLAY PANEL, MANUFACTURING METHOD THEREOF AND DISPLAY DEVICE

The present application is the U.S. national phase entry of PCT/CN2017/078031, with an international filing date of Mar. 24, 2017, which claims the benefit of Chinese Patent Application No. 201610319653.5 filed on May 13, 2016, the entire disclosure of which is incorporated herein by reference.

FIELD

The present application relates to the field of display, particularly to a display panel, a manufacturing method thereof and a display device.

BACKGROUND

At present, with increasing requirements for display accuracy of a display screen, the rendering technology has been more and more widely applied. The rendering technology adopts a relatively low process capability, and achieves a better display effect by sharing sub-pixels among pixels. Meanwhile, the touch technology has been a standard configuration for a display screen, especially for an in-cell touch screen that embeds a touch detection electrode into the display screen. This helps to reduce an overall thickness of the module, and also reduces the manufacturing cost of the touch screen greatly.

Currently, it is generally needed for an existing in-cell touch screen to arrange several hundreds of touch detection electrodes within the display panel in order to meet the touch accuracy. It is also needed to provide each touch detection electrode with a corresponding signal connection line, i.e., a touch signal line. If the touch signal line is drawn from left and right ends of the display panel, it will be unfavorable for a narrow frame design of the display panel. Moreover, because the touch accuracy is much less than the display accuracy, the number of touch signal lines will be smaller than the number of data lines. In this way, the lighting environment of sub-pixels provided with touch signal lines will differ from that of sub-pixels provided with no touch signal line, resulting in adverse effect on the display effect.

In a display panel using the rendering technology, data lines are fold lines, because two adjacent rows of sub-pixels will be spaced by a distance less than one sub-pixel in the column direction. When a dual-data line scheme is used for arrangement of the touch signal lines, problems such as short circuit may easily occur between data lines and touch signal lines.

SUMMARY

Embodiments of the present application provide a display panel, a manufacturing method thereof and a display device, for solving existing problems such as short circuit that may occur to data lines and touch signal lines when arranging touch signal lines in a film layer where the data lines locate in a display panel using the rendering technology.

According to one aspect, an embodiment of the present application provides a display panel, comprising: a pixel structure constituted by a plurality of sub-pixels; a plurality of data lines arranged at column gaps between the sub-pixels; a plurality of touch signal lines arranged at gaps between the sub-pixels; and a plurality of touch detection electrodes connected with the plurality of touch signal lines. Specifically, sub-pixels in each row are arranged in alignment, and sub-pixels in every two adjacent rows are spaced in a column direction by a distance of X sub-pixels, wherein 0<X<1. Also, a color of each sub-pixel differs from a color of an adjacent sub-pixel. Besides, the plurality of touch signal lines are insulated from the plurality of data lines.

In an embodiment, the plurality of touch signal lines and the plurality of data lines are arranged in different layers.

In an embodiment, the plurality of touch detection electrodes constitute a common electrode layer.

In an embodiment, a film layer where the plurality of touch signal lines locate is located between a film layer where the plurality of data lines locate and the common electrode layer.

In an embodiment, extending directions of the plurality of touch signal lines are consistent with those of the plurality of data lines.

In an embodiment, within a column gap of a same sub-pixel, an orthographic projection of a data line on a substrate covers an orthographic projection of a touch signal line.

In an embodiment, sub-pixels in two spaced rows are arranged in alignment in the column direction.

In an embodiment, each of the plurality of data lines is only connected with pixel switches of sub-pixels having a same color and being located at different sides.

In an embodiment, each of the plurality of data lines is connected with pixel switches of sub-pixels located at a same side.

According to another aspect, an embodiment of the present application provides a display device, comprising the above display panel provided by an embodiment of the present application.

According to a further aspect, an embodiment of the present application provides a method for manufacturing the above display panel. The method comprises: forming patterns of gate, gate insulating layer, active layer, and data line on a substrate successively; forming a first insulating layer on the pattern of data line; forming a pattern of touch signal line on the first insulating layer; forming a resin layer on the pattern of touch signal line, and forming patterns of resin layer and first insulating layer through one patterning process; and forming patterns of pixel electrode and common electrode layer that are insulated from each other on the pattern of resin layer.

Embodiments of the present application provide a display panel, a manufacturing method thereof and a display device. In the display panel provided by an embodiment of the present application, a pixel structure is constituted by a plurality of sub-pixels. Sub-pixels in each row are arranged in alignment, and sub-pixels in every two adjacent rows are spaced in the column direction by a distance of X sub-pixels, wherein 0<X<1. Also, the color of each sub-pixel differs from the color of an adjacent sub-pixel. The above display panel comprises a plurality of touch signal lines arranged at gaps between the sub-pixels. The plurality of touch signal lines are insulated from a plurality of data lines arranged at column gaps between the sub-pixels. The plurality of touch signal lines are connected with a plurality of corresponding touch detection electrodes. With an arrangement of the touch signal lines in a different layer from the data lines, the aperture ratio will not be occupied. Thus, differences in the lighting environment due to arrangement of the touch signal lines between the sub-pixels will not be caused either. Moreover, because the data lines and the touch signal lines

DETAILED DESCRIPTION OF THE EMBODIMENTS

In the following, specific implementations of the display panel, the manufacturing method thereof and the display device provided by embodiments of the present application will be explained in detail in conjunction with the drawings.

Shapes and sizes of each film layer in the drawings do not reflect a real proportion of the display panel, which is only aimed at explaining contents of the present application schematically.

An embodiment of the present application provides a display panel, comprising: a pixel structure constituted by a plurality of sub-pixels; a plurality of data lines S1, S2 . . . S6 arranged at column gaps between the sub-pixels; a plurality of touch signal lines arranged at gaps between the sub-pixels; and a plurality of touch detection electrode connected with the plurality of touch signal lines. Specifically, sub-pixels in each row are arranged in alignment, and sub-pixels in every two adjacent rows are spaced in the column direction by a distance of X sub-pixels, wherein 0<X<1. Also, the color of each sub-pixel differs from the color of an adjacent sub-pixel. Further, the plurality of touch signal lines and the plurality of data lines are insulated from each other.

Figure 2:
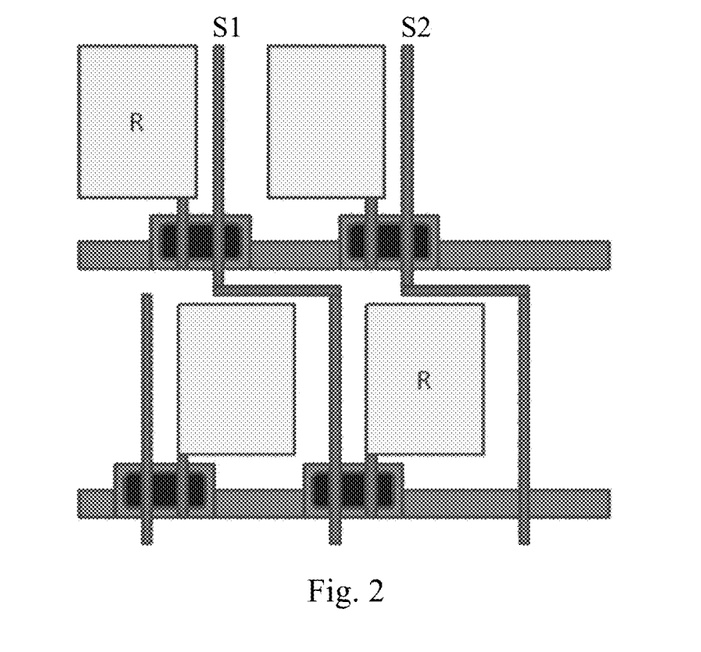
FIG. 2 is a local schematic view of a display panel in the prior art.
Figure 3:
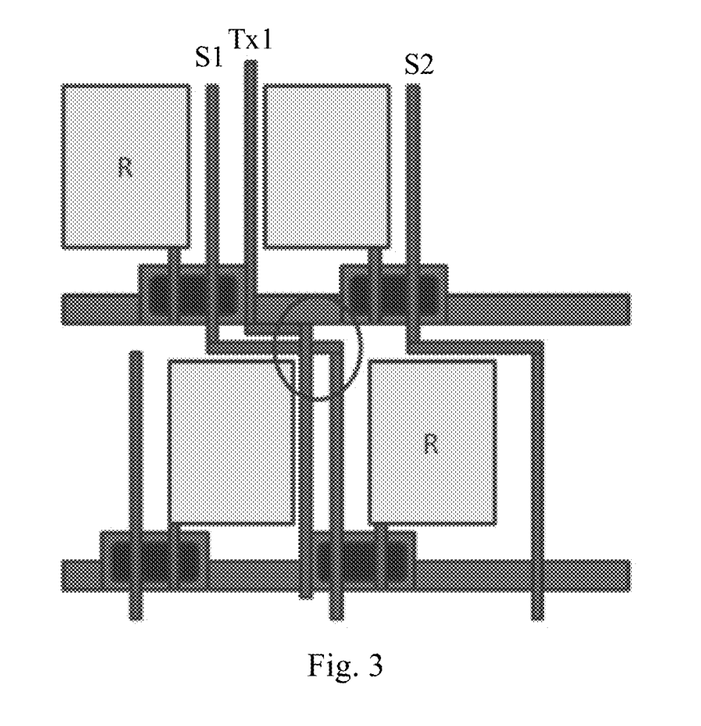
FIG. 3 is a local schematic view of a display panel in the prior art using a dual-data line structure.

In order to reduce power consumption when displaying monochrome images, the data lines can be arranged such that one data line only connects sub-pixels of one color. Thus, one data line will be connected with sub-pixels at left and right sides of different rows, as shown in FIG. 2. When a dual-data line scheme is used to arrange the touch signal lines, as shown in FIG. 3, short circuit may occur to the data line S1 and the touch signal line Tx1 (as shown by a circle in FIG. 3). Hence, it will be unsuitable to arrange the touch signal lines in a film layer where the data lines locate.

The above display panel provided by an embodiment of the present application comprises a plurality of touch signal lines arranged at gaps between the sub-pixels. The plurality of touch signal lines are insulated from the plurality of data lines arranged at column gaps between the sub-pixels. The plurality of touch signal lines are connected with a plurality of corresponding touch detection electrodes. With arrangement of the touch signal lines in a different layer from the data lines, the aperture ratio will not be occupied. In this way, differences in lighting environment due to arrangement of the touch signal lines between the sub-pixels will not be caused either. Moreover, because the data lines and the touch signal lines are arranged in different layers, problems such as short circuit between the two can be avoided.

Figure 4:
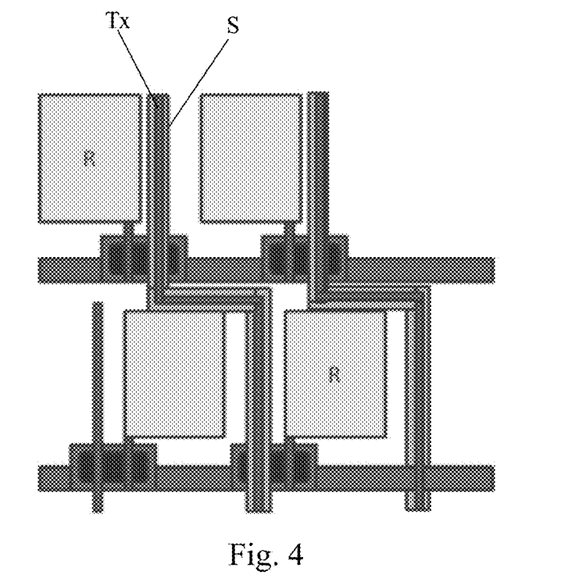
FIG. 4 is a local schematic view of a display panel provided by an embodiment of the present application.

As shown in FIG. 4, in specific implementations, in order to be benefit for application in a display device with a narrow frame, the touch signal lines should be prevented from extending out from left and right ends of the display panel. In the above display panel provided by an embodiment of the present application, generally, the extending direction of the touch signal line Tx is designed to be consistent to that of the data line S. I.e., the touch signal lines Tx are arranged along column gaps between the sub-pixels.

In order to have no influence on the aperture ratio of the display panel, in the above display panel provided by an embodiment of the present application, an orthographic projection of a data line S on a substrate within a column gap of a same sub-pixel covers an orthographic projection of a touch signal line Tx. That is to say, the line width of the touch signal line Tx is generally not greater than the line width of the data line S. The line width of the touch signal line Tx can be set to overlap with the line width of the data line S.

For the convenience of designing the pixel structure, in the above display panel provided by an embodiment of the present application, sub-pixels in two spaced rows are generally arranged in alignment in the column direction. I.e., sub-pixels in the odd rows are arranged in alignment, and sub-pixels in the even rows are arranged in alignment.

Figure 5:
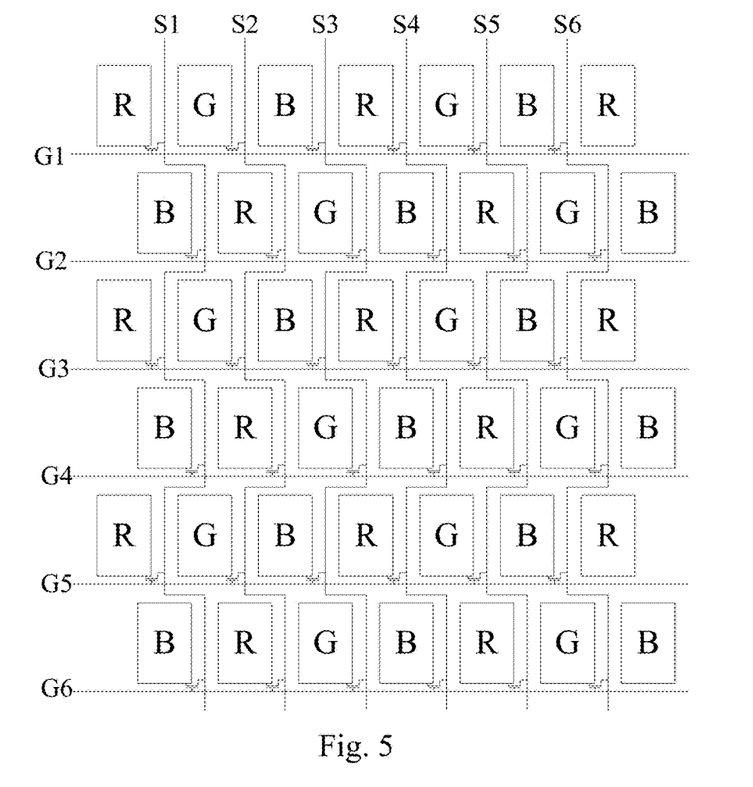
FIG. 5 is a structural schematic view of a display panel provided by an embodiment of the present application.

In the above display panel provided by an embodiment of the present application, a connection manner of column-inversion can be used between the data line and the sub-pixel. I.e., each data line is connected with the pixel switch of each sub-pixel at a same side. As shown in FIG. 5, each data line S1, S2 . . . S6 at least connects sub-pixels having two colors. When displaying a monochrome image, a plurality of data lines connected with the displayed monochrome image need to be turned on. For example, when it is needed to display a red image, four data lines of S1, S2, S4 and S5 need to be turned on.

Figure 1:
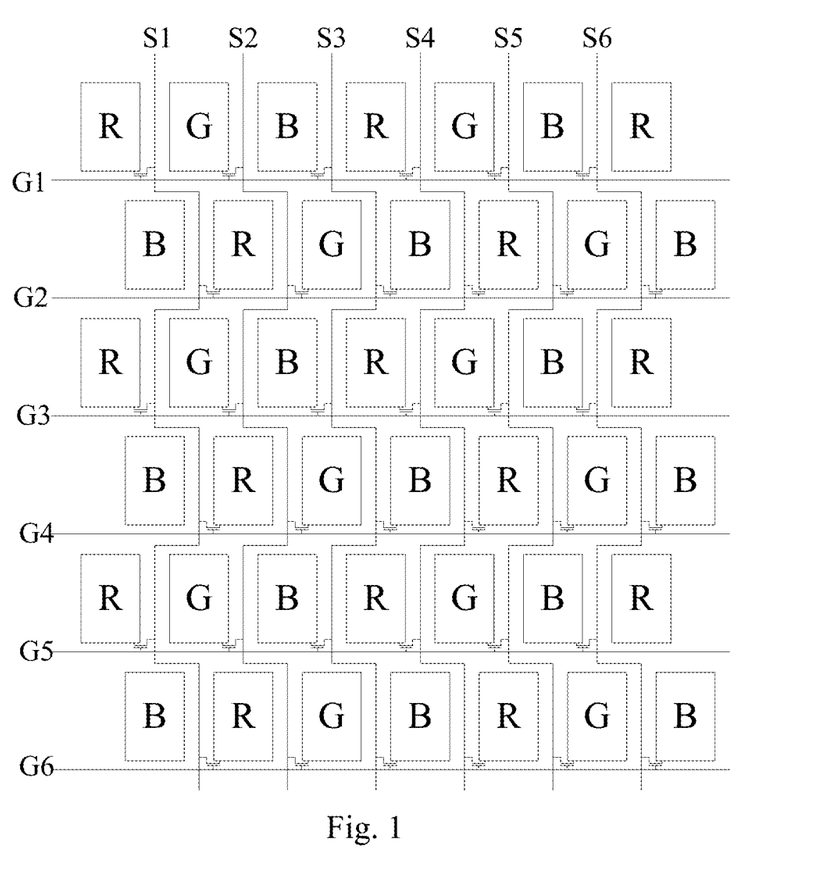
FIG. 1 is a structural schematic view of a display panel provided by an embodiment of the present application.

Alternatively, in the above display panel provided by an embodiment of the present application, a connection manner of Z-inversion can be used between the data line and the sub-pixels. As shown in FIG. 1, each data line S1, S2 . . . S6 is only connected with pixel switches of sub-pixels having the same color and being located at different sides. In this way, when displaying a monochrome image, only data lines connected with the displayed monochrome image need to be turned on. For example, when it is needed to display a red image, only two data lines of S1 and S4 need to be turned on, thereby enabling a decrease in the power consumption.

In order to simplify the display panel in structure, in the above display panel provided by an embodiment of the present application, a common electrode layer can be re-used to fulfill the function of touch detection electrode. This means that the touch detection electrodes constitute the common electrode layer. In this way, the number of film layers in the display panel is not increased, and the touch function is implemented.

Figure 6A:
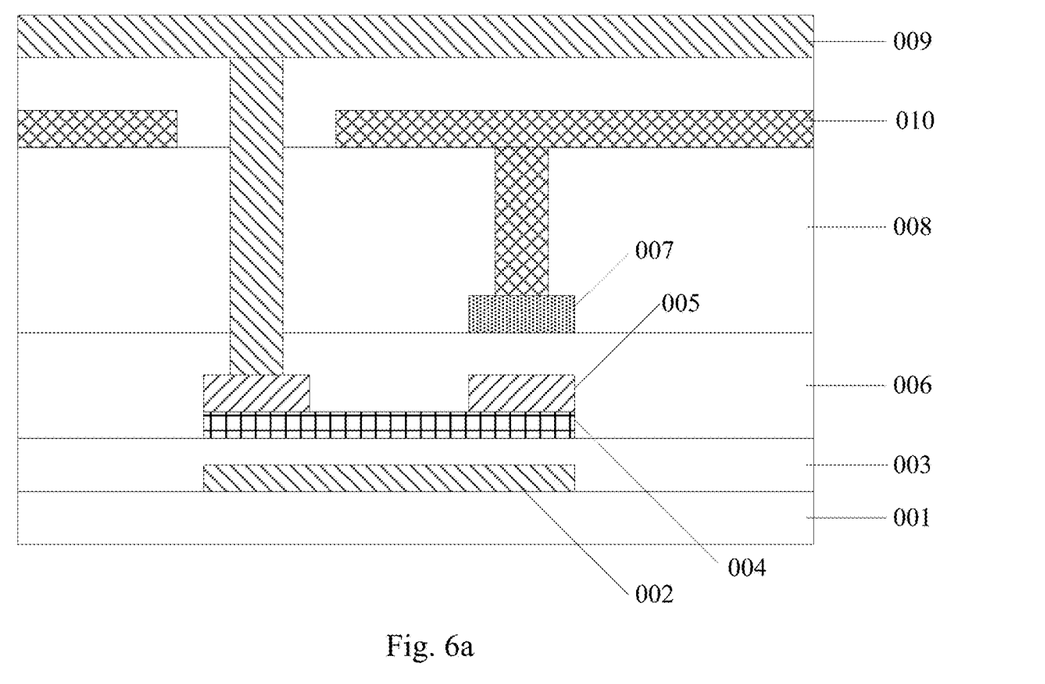
FIG. 6a and FIG. 6b are sectional schematic views of a display panel provided by an embodiment of the present application respectively.

Based on the structure where a common electrode layer is re-used as the touch detection electrodes, in the above display panel provided by an embodiment of the present application, as shown in FIG. 6a, the touch signal line 007 can be arranged in a film layer between the film layer where the data line 005 locates and the common electrode layer 010. In this way, there will be a resin layer 008 with a thickness of about 15000 Å between the touch signal line 007 and the common electrode layer 010, so that the capacitance between the common electrode layer 010 and the touch signal line 007 is relatively small. This helps to ensure that the touch signal line 007 has very small influence on other overlapping and unconnected touch detection electrodes, thereby improving accuracy of the touch detection.

Figure 6B:
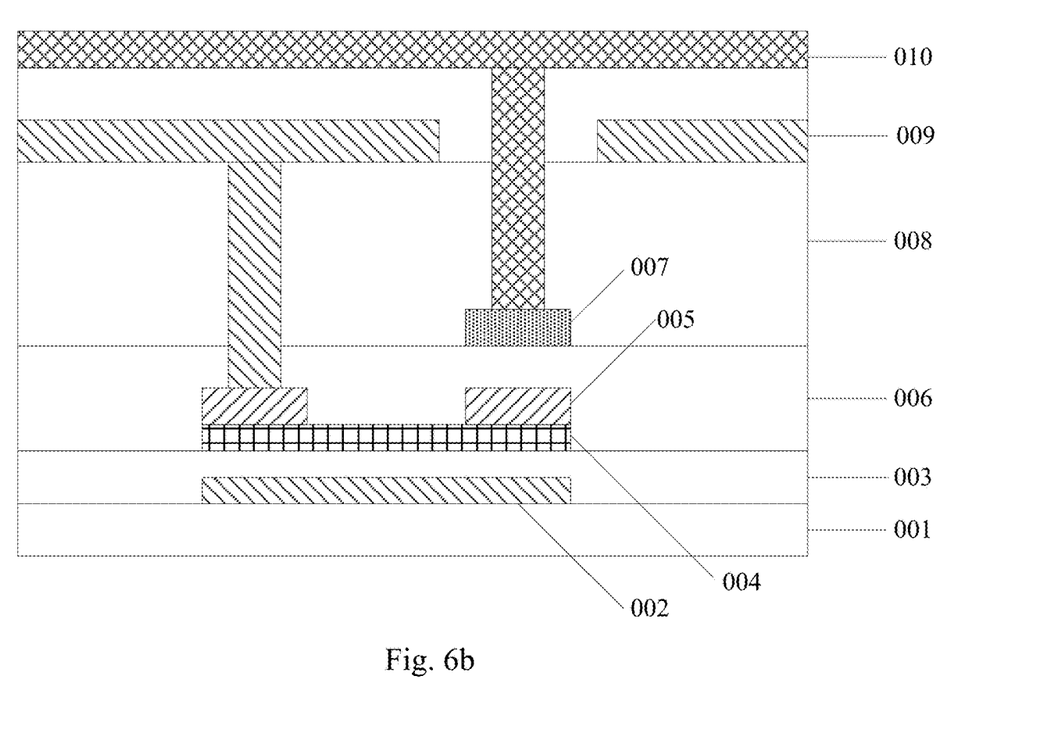

In the above display panel provided by an embodiment of the present application, a relative position between the pixel electrode comprised by each sub-pixel and the common electrode layer can be as shown in FIG. 6a, i.e., the pixel electrode 009 is located above the common electrode layer 010. Also, the case can be as shown in FIG. 6b, i.e., the pixel electrode 009 is located under the common electrode layer 010. The present application will not be defined here.

Figure 7:
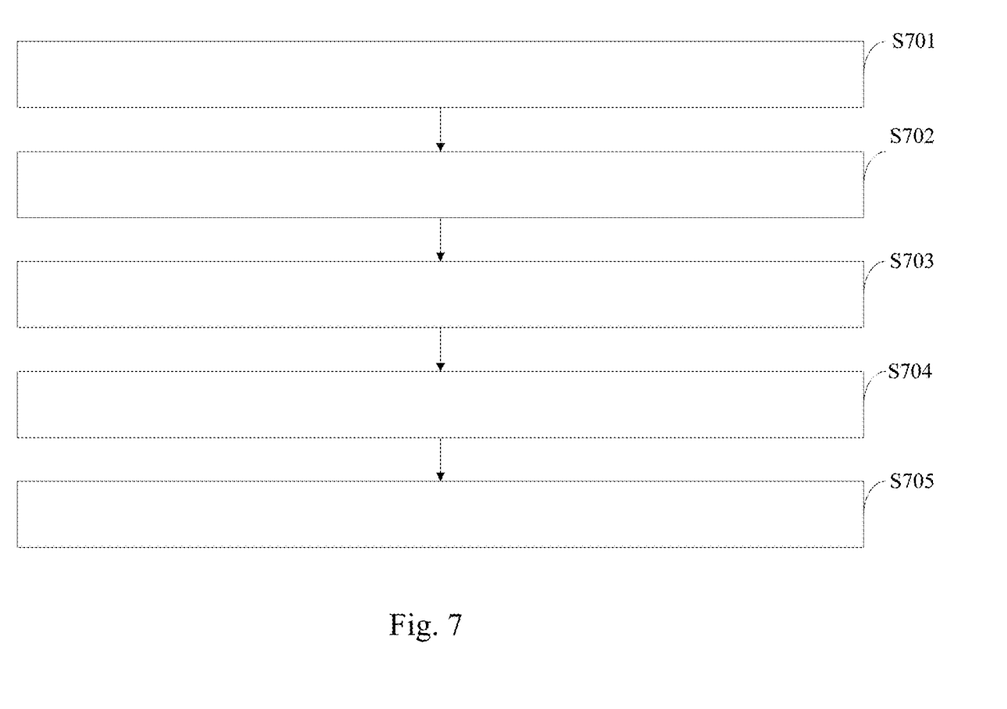
FIG. 7 is a flow chart of a method for manufacturing a display panel provided by an embodiment of the present application.

Based on a same inventive concept, an embodiment of the present application further provides a method for manufacturing the above display panel. As shown in FIG. 7, the method comprises the following steps.

S701, forming patterns of gate 002, gate insulating layer 003, active layer 004, and data line 005 on a substrate 001 successively;

S702, forming a first insulating layer 006 on the pattern of data line 005;

S703, forming a pattern of touch signal line 007 on the first insulating layer 006;

S704, forming a resin layer 008 on the pattern of touch signal line 007, and forming patterns of resin layer 008 and first insulating layer 006 through one patterning process; and S705, forming patterns of pixel electrode 009 and common electrode layer 010 that are insulated from each other on the pattern of resin layer 008.

In the above manufacturing method provided by an embodiment of the present application, the first insulating layer 006 does not need to be patterned after being formed in step S702. Instead, it is patterned with the resin layer 008 simultaneously in step S704. In this way, manufacturing of the display panel can be finished by using nine patterning processes. The nine patterning processes are specifically: the gate 002→the gate insulating layer 003→the active layer 004→the data line 005→the touch signal line 007→the resin layer 008 and the first insulating layer 006→the pixel electrode 009→the second insulating layer→the common electrode layer 010; or the gate 002→the gate insulating layer 003→the active layer 004→the data line 005→the touch signal line 007→the resin layer 008 and the first insulating layer 006→the common electrode layer 010→the resin layer 008 and the second insulating layer→the pixel electrode 009.

Based on a same inventive concept, an embodiment of the present application further provides a display device, comprising the above display panel provided by an embodiment of the present application. The display device can be any product or component with a display function, such as a mobile phone, a panel computer, a television, a display, a laptop, a digital photo frame, a navigator and so on. Embodiments of the display device can make reference to the embodiments of the above display panel, which will not be repeated here.

Embodiments of the present application provide a display panel, a manufacturing method thereof and a display device. In the display panel provided by an embodiment of the present application, a pixel structure is constituted by a plurality of sub-pixels. Sub-pixels in each row are arranged in alignment, and sub-pixels in every two adjacent rows are spaced by a distance of X sub-pixels in the column direction, wherein 0<X<1. Also, the color of each sub-pixel differs from the color of an adjacent sub-pixel. The above display panel comprises a plurality of touch signal lines arranged at gaps between the sub-pixels. The plurality of touch signal lines are insulated from a plurality of data lines arranged at column gaps between the sub-pixels. The plurality of touch signal lines are connected with a plurality of corresponding touch detection electrodes. By arranging the touch signal lines in a different layer from the data lines, the aperture ratio will not be occupied. Thus, differences in lighting environment due to arrangement of the touch signal lines between the sub-pixels will not be caused either. Moreover, because the data lines and the touch signal lines are arranged in different layers, problems such as short circuit between the two can be avoided.

Apparently, a skilled person in the art can make various modifications and variations to the present application without departing from the spirit and the scope of the present application. In this way, provided that these modification and variations of the present application belong to the scopes of claims in the present application as attached and the equivalent technologies thereof, the present application also intends to encompass these modifications and variations.

The invention claimed is:

1. A display panel, comprising:
   a pixel structure constituted by a plurality of sub-pixels, wherein sub-pixels, which are adjacent in a column direction, in every two adjacent rows are spaced in a row direction by a distance of X sub-pixels, $0<X<1$, and a color of each sub-pixel differs from a color of an adjacent sub-pixel;
   data lines and touch signal lines arranged at column gaps between the sub-pixels, wherein the touch signal lines and the data lines are insulated from each other; and
   a plurality of touch detection electrodes connected with the plurality of touch signal lines,
   wherein the touch signal lines and the data lines are arranged in different layers,
   wherein within a column gap of a same sub-pixel, an orthographic projection of a data line on a substrate covers an orthographic projection of a touch signal line,
   wherein the plurality of touch detection electrodes are re-used as a common electrode layer, and
   wherein a film layer where the plurality of touch signal lines locate is located between a film layer where the plurality of data lines locate and the common electrode layer.

2. The display panel as claimed in claim 1, wherein extending directions of the plurality of touch signal lines are consistent with extending directions of the plurality of data lines.

3. The display panel as claimed in claim 1, wherein sub-pixels in two spaced rows are arranged in alignment in the column direction.

4. The display panel as claimed in claim 1, wherein each of the plurality of data lines is only connected with pixel switches of sub-pixels having a same color and being located at different sides.

5. The display panel as claimed in claim 1, wherein each of the plurality of data lines is connected with pixel switches of sub-pixels located at a same side.

6. A display device, comprising the display panel as claimed in claim 1.

7. The display device as claimed in claim 6, wherein extending directions of the plurality of touch signal lines are consistent with extending directions of the plurality of data lines.

8. The display device as claimed in claim 6, wherein sub-pixels in two spaced rows are arranged in alignment in the column direction.

9. The display device as claimed in claim 6, wherein each of the plurality of data lines is only connected with pixel switches of sub-pixels having a same color and being located at different sides.

10. The display device as claimed in claim 6, wherein each of the plurality of data lines is connected with pixel switches of sub-pixels located at a same side.

11. A method for manufacturing the display panel as claimed in claim 1, comprising:
- forming patterns of gate, gate insulating layer, active layer, and data line on a substrate successively;
- forming a first insulating layer on the pattern of data line;
- forming a pattern of touch signal line on the first insulating layer;
- forming a resin layer on the pattern of touch signal line, and forming patterns of resin layer and first insulating layer through one patterning process; and
- forming patterns of pixel electrode and common electrode layer that are insulated from each other on the pattern of resin layer.

* * * * *